United States Patent
Nakamura et al.

[11] Patent Number: 5,948,159
[45] Date of Patent: Sep. 7, 1999

[54] METHOD OF CONTROLLING DEFECTS OF A SILICON SINGLE CRYSTAL

[75] Inventors: Kozo Nakamura; Toshiaki Saishoji; Toshimichi Kubota, all of Kanagawa, Japan

[73] Assignee: Komatsu Electronic Metals Co., Ltd., Kanagawa, Japan

[21] Appl. No.: 09/044,125

[22] Filed: Mar. 19, 1998

[30] Foreign Application Priority Data

Mar. 19, 1997 [JP] Japan ........................... 9-086137

[51] Int. Cl.⁶ ........................................ C30B 15/20
[52] U.S. Cl. ........................ 117/13; 117/2; 117/20
[58] Field of Search .................. 117/2, 3, 13, 20

[56] References Cited

FOREIGN PATENT DOCUMENTS

| 5-56588 | 3/1993 | Japan | H02K 3/46 |
| 5-70283 | 3/1993 | Japan | C30B 15/14 |
| 6-279188 | 10/1994 | Japan | C30B 29/06 |

OTHER PUBLICATIONS

"Diffusion Behavior of Point Defects in Si Crystal during Melt Growth IV: Numerical Analysis", Habu et al.; Jpn. J. Appl. Phys. vol. 33(1994) pp. 1234–1242, Part 1, No. 3A, Mar. 1994.

"Formation Process of Grown–In Defects in Czochralski Grown Silicon Crystals", Nakamura et al.; Journal of Crystal Growth 180(1997) 61–72.

"Control of Grown–in Defect Formation Process in Czochralski Silicon Crystals", Nakamura et al.; Proceedings of Kazusa Akademia Park Forum on the Science and Technology of Silicon Materials, Nov. 1997, pp. 197–210.

"On the dynamics of the oxidation–induced stacking–fault ring in as–grown Czochralski silicon crystals" Sinno et al., Appl. Phys. Lett. 70(17) Apr. 1997 pp.2250–2252.

"Transmission Electron Microscope Observation of "IR Scattering Defects" in As–Grown Czochralski Si Crystals", Kato et al., Jpn. J. Appl. Phys. vol. 35(1996) pp. 5597–5601, Part 1, No. 11, Nov. 1996.

"The Direct Observation of Grown–in Laser Scattering Tomography Defects in Czochralski Silicon", Nishimura et al., Journal of the Electrochemical Society, vol. 143, No. 10, Oct. 1996; pp. L243–L246.

*Primary Examiner*—Felisa Hiteshew
*Attorney, Agent, or Firm*—Sughrue, Mion, Zinn, Macpeak & Seas, PLLC

[57] ABSTRACT

When the silicon single crystal is pulled up, the nucleation rate of the void cluster is obtained from the forming energy of the cluster of the vacancies in the silicon single crystal. The growth shrinkage of the cluster is obtained basing on the deviation of the flowing-into amount to the cluster of the vacancies and the self-interstitials, and the pulling-up speed or the temperature distribution of the furnace is modified to inhibit the growth of the cluster so as to inhibit the grown-in defects of the silicon single crystal.

2 Claims, 5 Drawing Sheets

METHOD OF CONTROLLING DEFECTS OF A SILICON SINGLE CRYSTAL

BACKGROUND OF THE INVENTION

1. Field of the Invention

The present invention relates to a method of controlling the defects of a silicon single crystal, and in particular to a method of controlling the defects of a silicon single crystal, having a superior inhibiting effect on the defects introduced during the growth of the silicon single crystals, i.e., the so-called grown-in defects.

2. Description of the Related Art

As the grown-in defects generated during the growth of a CZ-silicon crystal degrade the reliability of the gate oxide film of a MOS device, it is necessary to reduce the grown-in defects. It is known that the densities of the grown-in defects are dependent on the heat history of a growing crystal, and thus the improvement on the optimization of the temperature distribution and the pulling speed of a single crystal is carried out by trial and error. For example, the reliability of the oxide film of a MOS device is strongly affected by the defects introduced during the growth of a silicon single crystal, which are detected as the LSTD (Laser Scattering Temograph Defect). Accordingly, the control and reduction of the formation of the defects are big problems to be solved. It is known by experiences that the control of the cooling process after crystallization has effect on the formation of the defects. A technique of inhibiting the defects by managing the temperature and the pulling speed is disclosed in the Unexamined Japanese Patent Publication (kokai) Nos. Hei. 5-70283, Hei. 5-56588 and Hei. 6-279188.

For the temperature distribution in a single crystal, the temperature at the crystallization end in contact with the silicon melt is highest, and is gradually reduced when departing from the crystallization end. Accordingly, it is thought that the control of cooling speed can be realized by a furnace structure that can properly set the axial temperature distribution and by properly setting the pulling speed of single crystals. That is, the change of the temperature in the axial direction is generally not a straight line, and the cooling speed passing through each temperature zone of a single crystal changes in a complicated manner. Moreover, as the heat history of each temperature zone influences the phenomena generated in the next temperature zone, the setting of conditions that renders a single crystal an appropriate temperature distribution is performed by trial and error which needs considerable labors. By means of the method disclosed in the prior art, it is not possible to predict the defect-forming density caused by the temperature history in advance, and thus considerable man-hour is necessary, and thus in fact an expected result can not be obtained.

SUMMARY OF THE INVENTION

It is an object of the invention to provide a method of controlling the defects of a silicon single crystal, in which the density of the defects formed during the pulling process of any heat history is predicated by modeling the occurring phenomena of the crystal defects; and basing on this, the temperature management of the growth of a CZ silicon and the control of the pulling speed are performed, and thus optimum growth of a CZ silicon and superior defect-inhibiting effect are obtained.

A method of controlling the defects of a silicon single crystal, comprises the steps of:

before the silicon single crystal is pulled up, obtaining the nucleation rate of the void cluster from the formation energy of the cluster of the vacancies in the silicon single crystal;

obtaining the growth shrinkage of the cluster basing on the deviation of the flowing-into amount to the cluster of the vacancies and the self-intersititials; and modifying the pulling-up speed or the temperature distribution of the furnace to inhibit the growth of the cluster so as to inhibit the grown-in defects of the silicon single crystal.

A method of controlling the defects of a silicon single crystal, according to the present invention comprises the steps of:

when the pulling-up process of the silicon single crystal is being processed, obtaining a nucleation rate of the void cluster from the formation energy of the cluster of the vacancies in the silicon single crystal in a preset pulling-up time unit;

obtaining the growth shrinkage of the cluster is obtained basing on the deviation of the flowing-into amount to the cluster of vacancies and self-interstitials; and modifying the pulling-up speed or the temperature distribution of the furnace in each preset pulling-up time unit to inhibit the grown-in defects of the silicon single crystal.

DETAILED DESCRIPTION OF THE INVENTION

Figure 1:
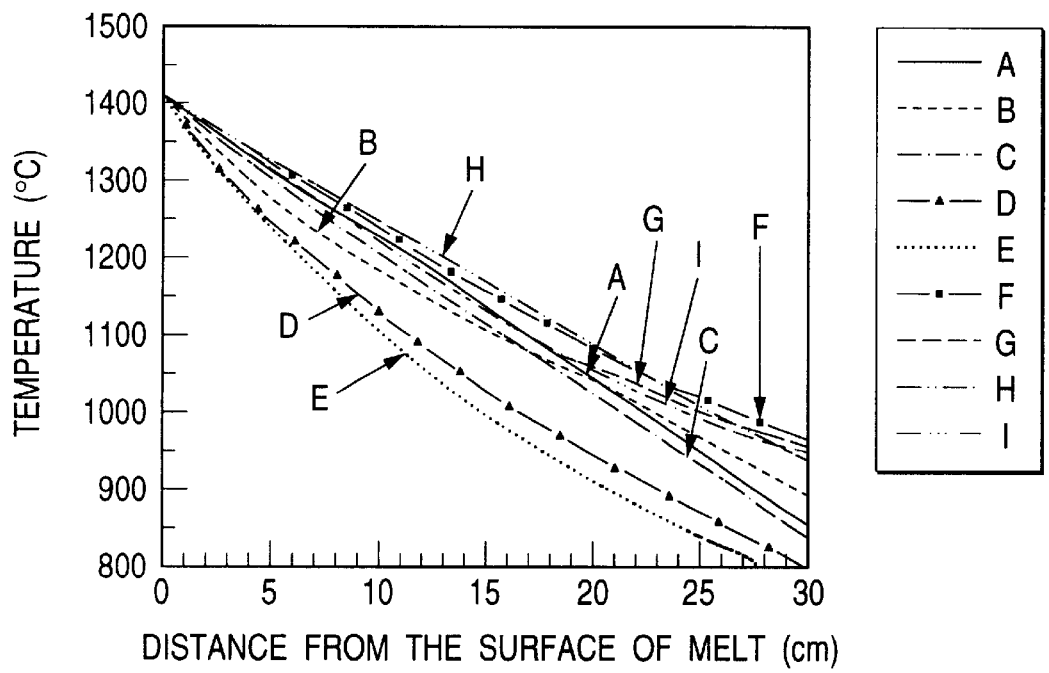
FIG. 1 is a diagram showing the axial direction temperature distribution of each samples A to I.

Detailed description of the drawings will be described referring to the accompanying drawings as follows.

The inventors of the invention have made extensive studies on the process of the formation of the grown-in defects and found the method of predicting the density of the defects formed. The LSTD grown-in defects being a void having a diameter of 100–150 nm has very recently become clear (see report, M. Kato, T. Yoshida, Y. Ikeda, Y. Kitagawa, Japan J. Appl. Phys. 35(1996) 5597; M. Nishiyama, S. Yoshino, H.Motorura and S. Shimura, T. Mchedidze, T. Hikone, J. Electrochem. Soc. 143 (1996) L243).

Accordingly, in view of that the LSTD are voids produced by the growth of the cluster of vacancy in the growth of the silicon, and thus the following means are adopted. First, when a silicon single crystal is crystallized, the vacancies and the self-interstitials of thermal equilibrium concentration at the melting point are entrapped in the crystals. And the concentrations are respectively expressed by the following formulae (1):

$$C_{vmp}=C_{vO}*\exp(-E_v^f/kT_{mp})$$

$$C_{Imp}=C_{IO}*\exp(-E_I^f/kT_{mp})$$

wherein $E_v^f$, $E_I^f$ are the formation energy for vacancies and self-interstitials, k is the Boltzman constant, and $T_{mp}$ is the temperature of the melting point (1685° K.).

When single crystals are pulled up, the upper portion is shifted to low temperature, and thus the vacancies and the lattice silicon are both in a supersaturated state. The chemical potential of each are indicated in the following formulae (2):

$$\mu_{gv}=kT \log(C_v/C_v^{eq})$$

$$\mu_{gI}=kT \log(C_I/C_I^{eq})$$

wherein $C_v^{eq}$ and $C_I^{eq}$ are respectively the thermal equilibrium concentration of the vacancies and the self-interstitials.

When the chemical potential is higher than the critical value for forming the defects, clusters are nucleated and the nucleation rate is computed. During the movement of the single crystals by the pulling up, vacancies and self-interstitials are respectively diffused and encountered each other, and thus pair annihilation occurs and the concentrations thereof change.

Regarding to the diffusion equations of the point defect such as the vacancies and the self intersititials, used are the following formulas (3) and (4) which has been proposed by R. Habu in Japan J. Appl. Phys. Vol. 33(1994), page 1234.

$$\partial C_v/\partial t = \text{div}[D_V\text{grad}C_V-\{v+(D_V(E_v^f-Q^*_v)/RT^2)\text{grad}T\}C_V]-[\{4\pi(D_V+D_I)R_CC_VC_I\}/E_F]\exp(-\Delta G_{IV}/RT)RT\ln(C_VC_I/C_VC_I^{eq}) \quad \text{Formula (3)}$$

$$\partial C_I/\partial t = \text{div}[D_I\text{grad}C_I-\{v+(D_I(E_I^f-Q^*_I)/RT^2)\text{grad}T\}C_I]-[\{4\pi(D_v+D_I)R_CC_VC_I\}/E_F]\exp(-\Delta G_{IV}/RT)RT\ln(C_VC_I/C_VC_I^{eq}) \quad \text{Formula (4)}$$

wherein $D_V$ and $D_I$ respectively are the diffusion coefficients of the vacancies and the self-interstitials, v is the growth ratio, $Q^*_v$ and $Q^*_I$ are the heat flow upon drift flows of the vacancies and the self-interstitials, $\Delta G_{IV}$ is the activation energy of the pair annihilation reaction of the vacancies and the self-interstitials, R is a gas constant, $E_P$ is an energy generated by the pair annihilation, $R_C$ is a critical distance where the pair annihilation of the voids and the self-interstitials can occur. Here, the following values are provided.

$\Delta G_{IV}=RT(7.0+15.0\ln(T/570))$ cal/mol $Q^*_V=Q^*_I=-1.8$ kcal/mol $E_F=253$ kcal/mol $R_C=10^{-7}$ cm In the growth conditions of a normal range, the vacancies are dominant, and thus it is presumed that the defects formed are the voids of the grown clusters of the vacancies. The nucleation rate of the clusters of the vacancies and the growth thereof are computed. The change of the energy by the formation of the spherical cluster of the vacancies are indicated in the following formula (5):

$$\Delta G=(-4\pi r^3/3V)*kT \log(C_v/C_v^{eq})+4\pi r^2\sigma$$

wherein V is the volume of one vacancy, σ is the surface energy of the void (silicon), and r is the radius of the cluster.

The first portion of the above formula (5) is the energy-reducing portion by the annihilation of the vacancies, and the second portion of the formula is the energy-increasing portion by the new surface formation because of adding the vacancies.

According to the classic nucleation theory, the radius r which renders the formula (5) maximum is the critical nucleus radius, and the nucleation speed of the cluster having the radius exceeding the critical nucleus is the nucleation rate. The critical nucleus radius is obtained by differentiation and is indicated by the following formula (6):

$$r_{cri}=16 \pi\sigma^3 V^2/3[kT \log(C_v/C_v^{eq})]^2$$

The nucleation rate is the product of the frequency of the formation of the cluster of the critical nuclear size by the heat fluctuation and the speed the vacancy renders on the cluster, and is indicated by the following formula (7):

$$J=z*C_v^{2}*\exp[-\Delta G_v(r_{cri}/kT]*4\pi r_{cri}^2*(D_v/a)$$

wherein J is number of the cluster nucleated in unit volume and unit time, $\Delta G_v$ is a value which is obtained when r of the critical nucleus obtained in the formula (6) is substituted into formula (5), z is the fitting parameter, $D_v$ is the diffusion constant of the vacancies, and a is the atom space. The forming number of the clusters in single crystals at each grid, each time is obtained by the above formula (7).

The vacancies and the self-interstitials flow into the formed clusters. The clusters grow when flowing into the vacancies, and shrinks when flowing into the self-interstitials. As the flowing-into occurs immediately after the formation, it is necessary to compute the growth and shrinkage of the clusters in each time period of the formation respectively.

The inventors computed the growth and the shrinkage of the clusters in each preset time period of each grid by the following formula (8).

$$\partial r/\partial t=V/r\{\{D_v/(1+D_v/K_r r)\}*(C_V-C_V^{eq})-\{D_I/(1+D_I/K_r r)\}*(C_I-C_I^{eq})\}$$

Provided that kr is the interface reaction constant. The numbers per unit time of the vacancies and the self-interstitials that flow into the particles having a radius r are indicated respectively by the following formulae (9).

$$J_v=4\pi r*\{D_v/(1-D_v/K_r r)\}*(C_V-C_v^{eq})$$

$$J_I=4\pi r*\{D_I/(1-D_I/K_r r)\}*(C_I-C_I^{eq})$$

The concentrations of the vacancies and the self-interstitials significantly change by the flowing-into to the defects, and thus the change of the flowing-into part to the defects is added to the computed results of the above diffusion and pair annihilation when the concentrations are computed. Examples of the computation are indicated below. FIG. 1 shows the temperature distribution of a number of crystal samples. The LSTD densities of the crystals obtained by pulling the crystals A to I having the axial directional temperature distribution as shown in FIG. 1 and by the pulling up speed as shown in Table 1 were measured, and were compared with the defect densities computed by the invention. The results are shown in Table 1 and FIG. 2.

TABLE 1

| No. | Crystal Diameter (mm) | Pulling up Speed (mm/min) | LSTD Density (/cm³) | Defect Density Computed by the Invention (/cm³) |
|---|---|---|---|---|
| A | 100 | 1.30 | 1.80E + 06 | 2.01E + 06 |
| B | 150 | 0.78 | 1.17E + 06 | 1.49E + 06 |

TABLE 1-continued

| No. | Crystal Diameter (mm) | Pulling up Speed (mm/min) | LSTD Density (/cm$^3$) | Defect Density Computed by the Invention (/cm$^3$) |
|---|---|---|---|---|
| C | 150 | 0.67 | 9.25E + 05 | 1.18E + 06 |
| D | 150 | 1.17 | 3.20E + 06 | 3.86E + 06 |
| E | 150 | 0.81 | 4.50E + 06 | 5.36E + 06 |
| F | 200 | 0.80 | 5.35E + 05 | 5.07E + 05 |
| G | 200 | 0.58 | 4.01E + 05 | 4.11E + 05 |
| H | 200 | 0.64 | 5.56E + 05 | 6.31E + 05 |
| I | 200 | 0.65 | 5.97E + 05 | 5.90E + 05 |

The above Table 1 is a table in which the LSTD densities of the crystals obtained by pulling the crystals A to I having the axial directional temperature distribution as shown in FIG. 1 and by the pulling up speed as shown in Table 1 are compared with the defect densities computed by the invention.

Figure 2:
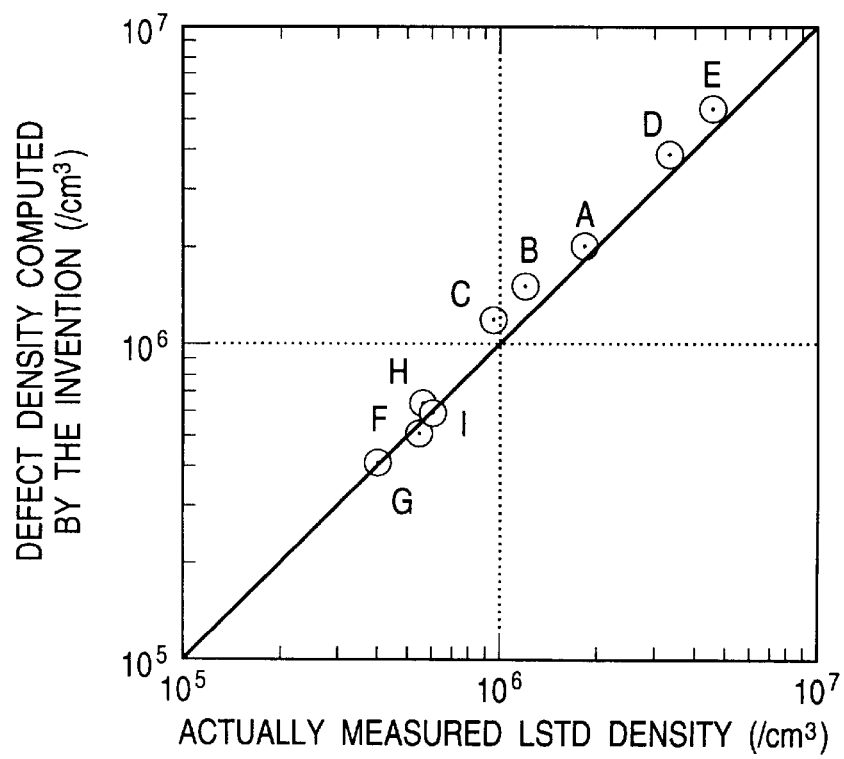
FIG. 2 is a diagram comparing the actually measured LSTD and the computed defect density according to a first embodiment.

As it is clear from Table 1 and FIG. 2 that the computed results are closely consistent with the actually measured values. The necessary parameters for this computation are indicated in the following.

$D_v = 40.52 \exp(-1.64 \text{ leV}/K_B T)$ cm$^2$/sec $D_I = 6.63 \ast 10^{-3} \exp(-0.55 \text{ eV}/K_B T)$ cm$^2$/sec $C_V^{eq} = 5.042 \ast 10^{26} \exp(-3.9 \text{ eV}/K_B T)$/cm$^3$ $C_I^{eq} = 2.3477 \ast 10^{28} \exp(-4.5 \text{ eV}/K_B T)$/cm$^3$ $\sigma = 1.08$ J/cm$^2$ kr = 10.0 cm/sec

Z = 1.0

In this invention, the change of the formation of the vacancy cluster is obtained from the chemical potential and surface energy of the vacancies (formula (5)), the nucleus forming ratio of the vacancy cluster is computed from the formation energy (formula (7)), the growth of the vacancy clusters is under a presumption of steady state diffusion field and is obtained from the deviation of the vacancies and lattices silicon flowed into the cluster (formula (8)). Thus it is possible to predict the grown-in LSTD density for any heat history, and in this way, the optimum silicon growing conditions are set.

This can be treated by the following way. That is, by inputting the pulling up speed of the silicon, the shape (diameter) data of the silicon single crystals and the temperature data at each position of the single crystal, computing the concentration distribution according to the diffusion and pair annihilation of the point defects of each position of the single crystal such as the vacancies and the self-interstitials, and obtaining the cluster-forming number by the point defect concentration, the growth of the cluster by absorbing point defect is computed. The absorbed amount of the point defect is fed back, the computation treatment of the concentration distribution is repeated and this is performed at each single crystal position until the pulling up is finished.

In this way, it is possible to output the defect density and size at the finish of the pulling up.

Accordingly, according to the defect controlling method of silicon single crystals of the invention, before when silicon single crystals are pulled up, the nucleation rate of the vacancy cluster is obtained from the formation energy of the cluster of the vacancies in the silicon single crystal, the growth shrinkage of the cluster is obtained basing on the deviation of the flowing-into amount to the cluster of the vacancies and the self-interstitials, and the pulling-up speed or the temperature distribution of the furnace is modified to inhibit the growth of the cluster so as to inhibit the grown-in defects of the silicon single crystals.

Moreover, in the pulling-up process of the silicon single crystal being proceeded, the formation rate of the void cluster is obtained from the forming-energy of the cluster of the vacancies in the silicon single crystal in a preset pulling-up time unit, the growth shrinkage of the cluster is obtained basing on the deviation of the flowing-into amount to the cluster of the vacancies and the self-interstitials, and the pulling-up speed or the temperature distribution of the furnace in each preset pulling-up time unit is modified to inhibit the grown-in defects of the silicon single crystals.

Embodiments

Figure 3:
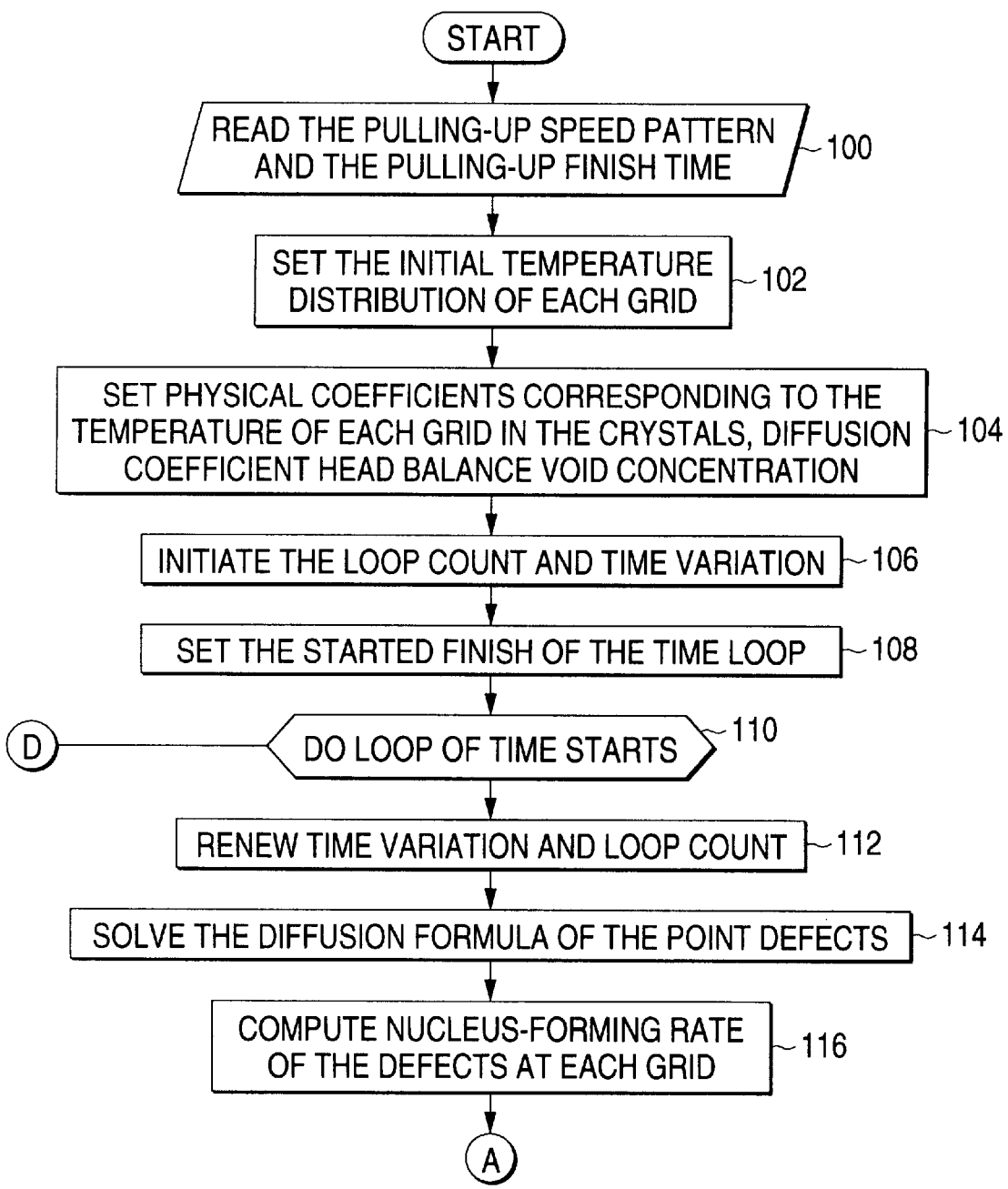
FIG. 3 is a part of the flow chart of controlling the defects of a silicon single crystal.
Figure 4:
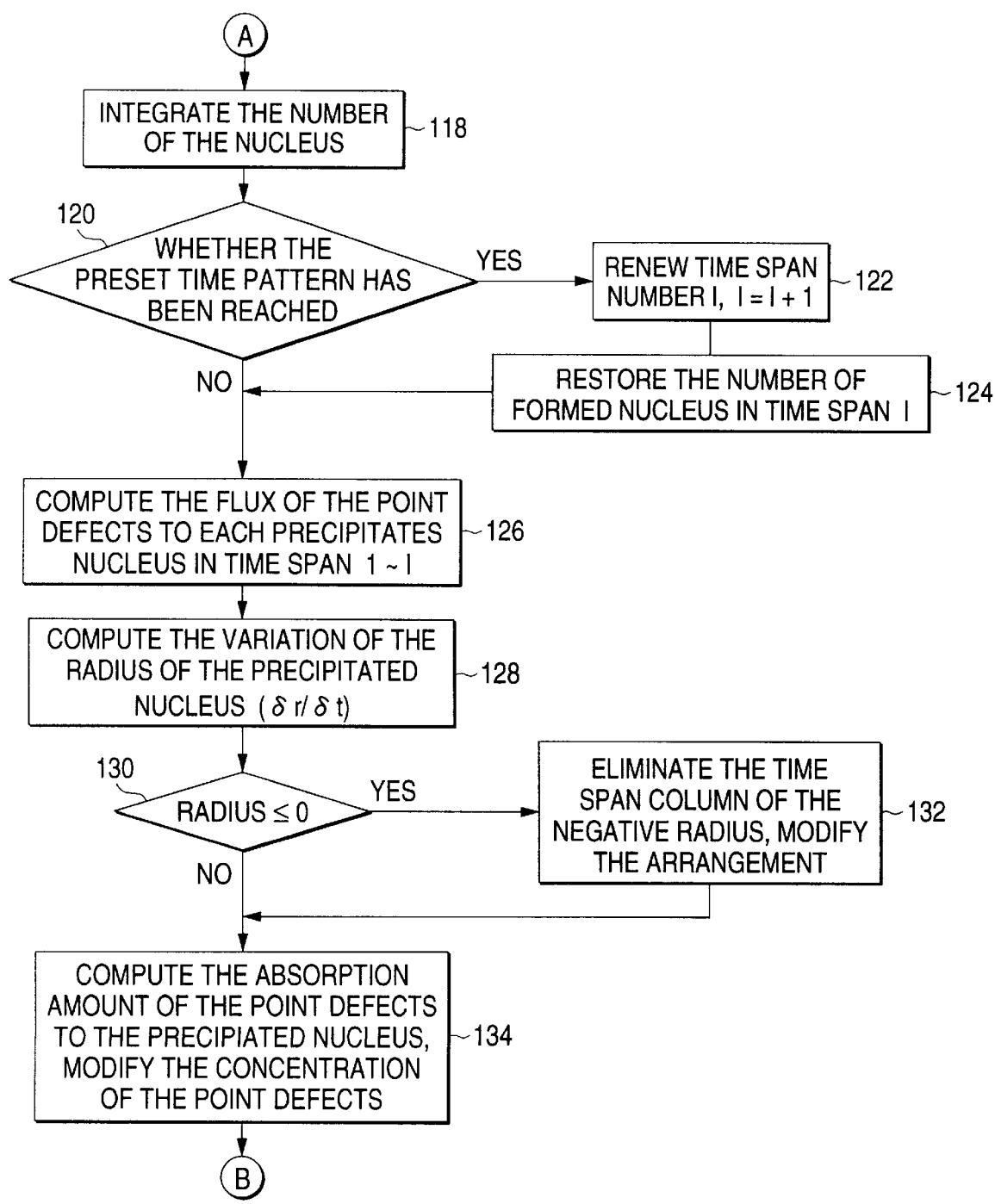
FIG. 4 is a part of the flow chart of controlling the defects of a silicon single crystal.
Figure 5:
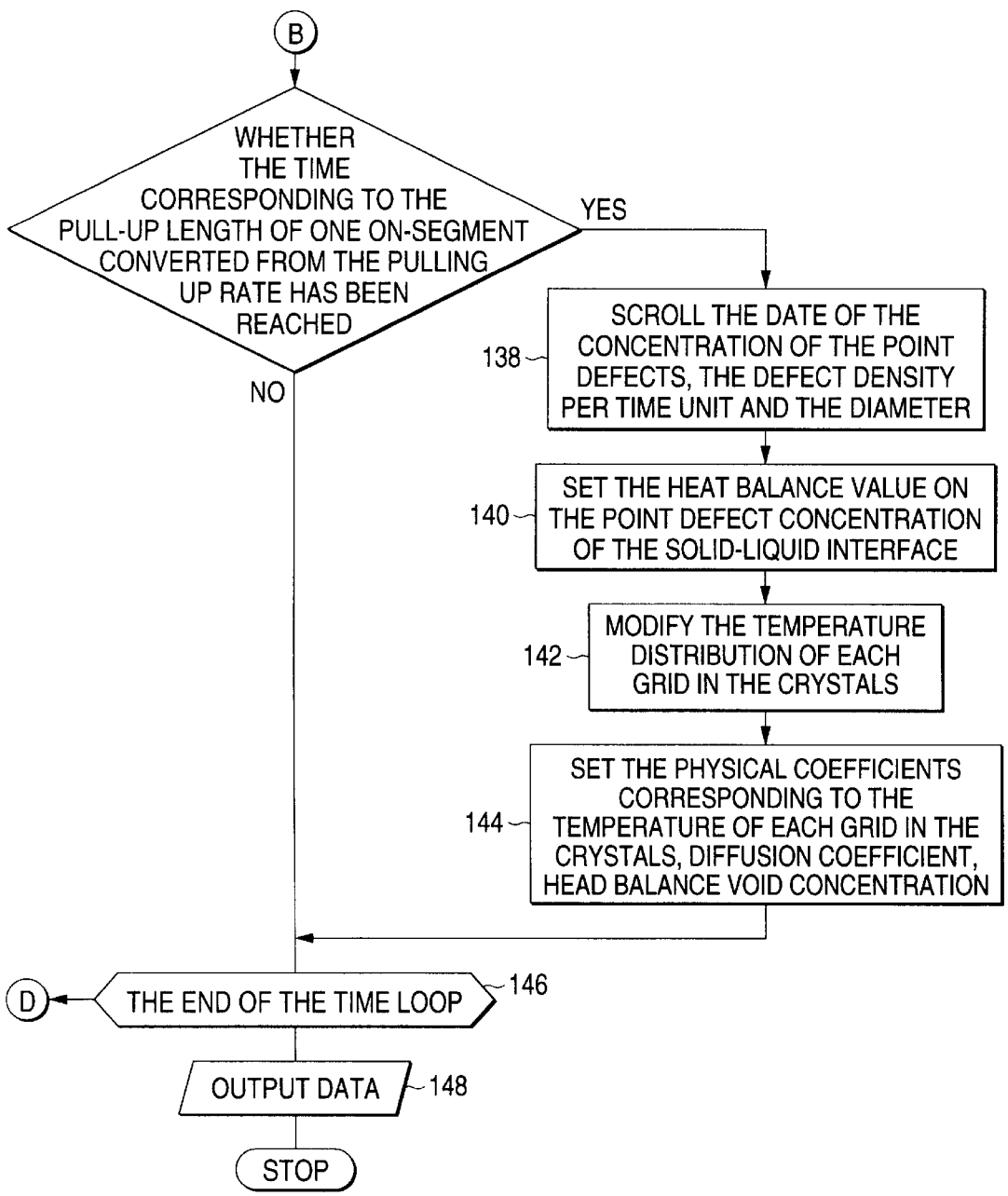
FIG. 5 is a part of the flow chart of controlling the defects of a silicon single crystal.

FIG. 3 to FIG. 5 show the flowchart for performing the defect-controlling method of a silicon single crystal of the invention. The CZ silicon pulling-up apparatus can use a normal one. First, the preset silicon pulling-up speed pattern and the pulling-up finish time are read (step 100). Next, the initial temperature distribution of each grid in crystal is set (step 102) and the physical coefficients such as the diffusion-coefficient or the thermal equilibrium vacancy concentration corresponding to the temperature of each grid in the crystals are set (step 104). The temperature distribution is set as the temperature distribution in the growth which is the temperature distribution obtained by the actually measured data or by the global heat transfer analysis. Thereafter, the initiation of the loop count and time variation is performed (step 106), and the start and finish of the time loop are set (step 108).

After the initiation treatment is finished, the DO loop of the time starts (step 110), and the time variation and the loop count are renewed (step 112). First, the diffusion formula of the point defect is solved (step 114). Then the nucleation rate J of the defects at each grid is computed basing on formula (7) and from the formulas (5) and (6) (step 116). Next, as shown in FIG. 4, the number of the forming nucleus at each time period, obtained from formula (7) is integrated (step 118).

After the computation treatment, judge whether the preset time pattern has been reached or not (step 120). If the time pattern has been reached, renew the time span number I (I+1) (step 122), and restore the number of the formed nucleus in the time span I (step 124). The time span is repeated, and the flux of the point defects to each precipitated nucleus in the time span 1~I is computed from formula (9) (step 126). Thereafter, the variation of the radius of the precipitated nuclear is computed from formula (8) (step 128), and the positive or negative of the variation of the radius is judged (step 130). If the variation of the radius of the precipitated nucleus is negative, the time span column of the negative radius is eliminated, and the arrangement is modified (step 132). If the variation of the radius is positive, the absorption amount of the point defects to the precipitated nucleus is computed, and the concentration of the point defects is modified (step 134). The modification of the concentration of the point defects can be performed by adding the variation of the flowing-into amount of the point defects to the computation results of the diffusion and the pair annihilation.

Thereafter, as shown in FIG. 5, judge whether it has reached the time that corresponds to the pulled-up length of one on-segment converted from the pulling up rate (step 136). If the time has been reached, the data of the concentration of the point defects, the defect density per time unit and the diameter are scrolled to one on-segment (step 138). Next, the thermal equilibrium value is set on the point defect concentration at the solid-liquid interface (step 140). Next, the temperature distribution of each grid in the crystals is modified (step 142) and the physical coefficient such as the diffusion coefficient, the thermal equilibrium vacancy concentration corresponding to the temperature of each grid in the crystals are set (step 144).

The treatment is performed until the end of the time loop (step 146), and data is output at the finish stage of the time loop (step 148).

As described above, in this preferred embodiment, the computation treatment is performed from a point of view that when growing the silicon single crystal, the expansion and shrinkage of the vacancy clusters are performed by the deviation of the flowing-into amount of the vacancies and self-interstitials to the defects. Thus the predication of the LSTD density is possible. Accordingly, by feeding back the temperature distribution in the furnace and the pulling-up speed to minimize the defects, and controlling the defect concentration to be minimum any time during the growth of the silicon single crystal, it is possible to grow silicon single crystal having the LSTD density being inhibited to the minimum. Moreover, the LSTD density corresponding to the thermal history with respect to one silicon single crystal rod is computed by the above method, and this is reflected on the temperature distribution of the furnace for growing the silicon and the pulling-up speed, and thus an optimum furnace can be made.

According to the method of the present invention, it is possible to preciously estimate the defect density. However, there are various models regarding to the diffusion and aggregation of the point defect in silicon. The above embodiment is an example which employs the diffusion equation of the point defect proposed by R. Habu. This equation is very effective as the present inventor described in J. Crystal Growth Vol. 180 (1997) page 61, and Proceedings of Kazusa Akademia Park Forum on The Science and Technology of Silicon Materials, Nov. 12–14, 1997, p197. However, concerning to the point defect diffusion, there is a model proposed by T. Sinno and R. A. Brown et al. (Apply Physics Letter Vol. 70 (1997) p. 2550) in addition to the equation proposed by R. Habu. It is also possible to use them which is shown as the following formulas (10) and (11).

$$\partial C_V/\partial t = \mathrm{div}[D_V \mathrm{grad} C_V - vC_V] - 4\pi(D_V+D_I)R_C \exp(-\Delta G_{IV}/RT)(C_V C_I - C_V^{eq} C_I^{eq}) \quad \text{Formula (10)}$$

$$\partial C_I/\partial t = \mathrm{div}[D_I \mathrm{grad} C_I - vC_I] - 4\pi(D_V+D_I)R_C \exp(-\Delta G_{IV}/RT)(C_V C_I - C_V^{eq} C_I^{eq}) \quad \text{Formula (11)}$$

In addition, there are no fixed values as an established theory regarding to values such as the diffusion coefficient of the voids and the self-interstitials and the thermal equilibrium concentration which are necessary to the calculation. In view of such a condition, the inventors of the present invention found a method for selecting the parameters of the point defect, which can obtain the effective calculation result.

Here, a correction process in which the formulas (10) and (11) are used in place of the formulas (3) and (4) used in the above embodiment will be described as follows. The process can be applied to a case in which-other formulas except the formulas (10) and (11) are used.

As indicated in Proceedings of Kazusa Akademia Park Forum on The Science and Technology of Silicon Materials, Nov. 12–14, 1997, p197 of the present inventors, the relative supersaturation of the voids and the self-interstitials at 1,000° C. has the relationship as the following formula (12).

$$\Delta C = (C_V - C_V^{eq}) - (C_I - C_I^{eq})$$

Condition 1: v/G=0.15 (mm²/sec° C.) ΔC=0

Condition 2: v/G=0.30 (mm²/sec° C.) ΔC=1*10¹⁴ (cm⁻³)

Here, v is the growth rate (mm/sec), and G is the axial-direction temperature gradient in crystal at the solid-liquid interface (° C./mm).

As first process, the parameters of the point defect, i.e., the diffusion coefficient, the thermal equilibrium concentration and $\Delta G_{IV}$, satisfying the conditions 1 and 2 are selected.
Condition 3: defect generation temperature: 1100° C.

As second process, the surface energy σ of silicon is selected so that the defect generates at 1100° C. that it is known as a temperature at which the defect generates. It is easy to select σ because of the larger σ the lower the temperature at which the defect generates.

As third process, the interface reaction constant k is determined. When k is made larger, the defect size is increased and the density is lowered. Accordingly, k should be adjusted so as to correspond to the density of the defect which is actually measured. When k is extremely large, it is possible to use the following formulas (13) and (14) in place of the formulas (8) and (9).

$$\partial r/\partial t = Vs/r[\{D_V(C_V - C_V^{eq})\} - \{D_I(C_I - C_I^{eq})\}] \quad \text{Formula (13)}$$

$$J_V = 4\pi r^* D_V(C_V - C_V^{eq})$$

$$J_I = 4\pi r^* D_I(C_I - C_I^{eq}) \quad \text{Formula (14)}$$

It has been confirmed that the calculation results using the parameters determined in the above processes excellently estimate the defect density in any case under the general crystal growth conditions.

Figure 6:
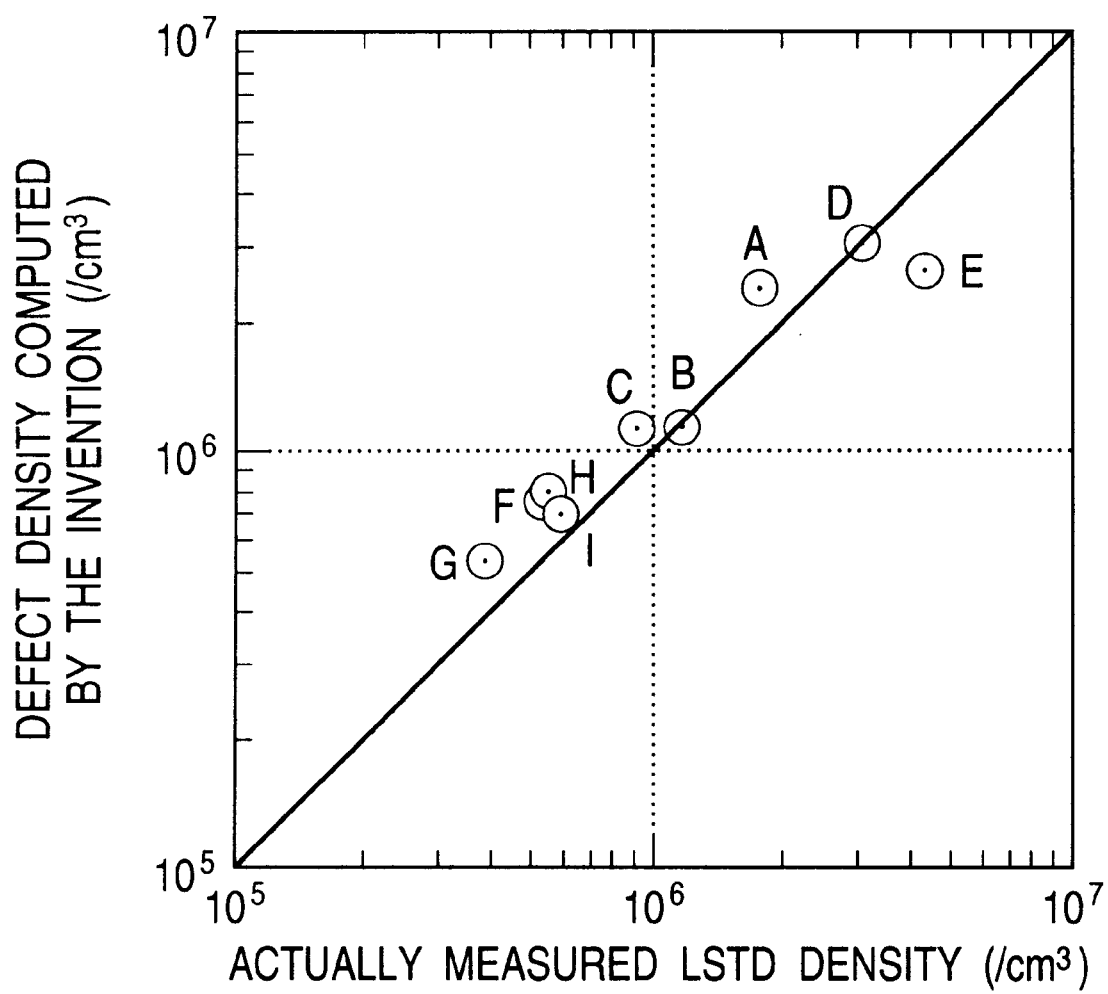
FIG. 6 is a diagram comparing the actually measured LSTD and the computed defect density according to a second embodiment.

Second Embodiment using the formulas (10) and (11) in which the corresponding conditions to the first embodiment are used are exhibited in Table 2 and FIG. 6.

TABLE 2

| No. | Crystal Diameter (mm) | Pulling up Speed (mm/min) | LSTD Density (/cm³) | Defect Density (/cm³) Embodiment | |
|---|---|---|---|---|---|
| | | | | first | Second |
| A | 100 | 1.30 | 1.80E + 06 | 2.01E + 06 | 2.52E + 06 |
| B | 150 | 0.78 | 1.17E + 06 | 1.49E + 06 | 1.15E + 06 |
| C | 150 | 0.67 | 9.25E + 05 | 1.18E + 06 | 1.13E + 06 |
| D | 150 | 1.17 | 3.20E + 06 | 3.86E + 06 | 3.17E + 06 |
| E | 150 | 0.81 | 4.50E + 06 | 5.36E + 06 | 2.77E + 06 |
| F | 200 | 0.80 | 5.35E + 05 | 5.07E + 05 | 7.62E + 06 |
| G | 200 | 0.58 | 4.01E + 05 | 4.11E + 05 | 5.35E + 06 |
| H | 200 | 0.64 | 5.56E + 05 | 6.31E + 05 | 7.95E + 06 |
| I | 200 | 0.65 | 5.97E + 05 | 5.90E + 05 | 7.20E + 06 |

In this case, used parameters are as follows.

$D_V = 2.36 \times 10^{-4} \exp(-0.3 \text{ eV}/K_B T) \text{ cm}^2/\text{sec}$ $D_I = 6.07 \exp(-1.5 \text{ eV}//K_B T) \text{ cm}^2/\text{sec}$ $C_V^{eq} = 3.10 \times 10^{26} \exp(-3.7 \text{ eV}//K_B T)/\text{cm}^3$ $C_I^{eq} = 1.81 \times 10^{25} \exp(-3.3 \text{ eV}//K_B T)/\text{cm}^3$ $\Delta G_{IV} = 1.5 \text{ eV}$ $R_C = 0.543 \text{ nm}$ $\sigma = 0.61 \text{ J/m}^3$ $k = \infty$ As described above, according to the method of controlling the defects of a silicon single crystal, before when silicon single crystal is pulled up, the nucleation rate of the void cluster is obtained from the forming energy of the cluster of the vacancies in the silicon single crystal, the growth shrinkage of the cluster is obtained basing on the deviation of the flowing-into amount to the cluster of the vacancies and the self-interstitials, and the pulling-up speed or the temperature distribution of the furnace is modified to inhibit the growth of the cluster so as to inhibit the grown-in defects of the silicon single crystal. Accordingly, the density of the defects formed during the pulling-up in any heat history is predicted, and basing on this, the temperature management during the growth of the silicon single crystal and the control of the pulling-up speed are performed. Thus, it is possible to grow optimum silicon single crystal and proceed the control of the defect of silicon single crystal with a high defect-inhibiting effect.

What is claimed is:

1. A method of controlling the defects of a silicon single crystal, comprising the steps of:

before the silicon single crystal is pulled up, obtaining a nucleation rate of a vacancy cluster from a formation energy of a cluster of vacancies in the silicon single crystal;

obtaining a growth shrinkage of the cluster basing on a deviation of a flowing-into amount to the cluster of the vacancies and a self-interstitials; and modifying a pulling-up speed or a temperature distribution of a furnace to inhibit a growth of the cluster so as to inhibit a grown-in defect of the silicon single crystal.

2. A method of controlling the defects of a silicon single crystal, comprising the steps of:

when the pulling-up process of the silicon single crystal is being processed, obtaining a nucleation rate of the void cluster from the formation energy of the cluster of the vacancies in the silicon single crystal in a preset pulling-up time unit;

obtaining the growth shrinkage of the cluster is obtained basing on the deviation of the flowing-into amount to the cluster of vacancies and self-interstitials; and modifying the pulling-up speed or the temperature distribution of the furnace in each preset pulling-up time unit to inhibit the grown-in defects of the silicon single crystal.

* * * * *